(12) United States Patent
Lee et al.

(10) Patent No.: US 10,308,121 B2
(45) Date of Patent: Jun. 4, 2019

(54) SOLAR CELL SYSTEM AND CONTROL METHOD THEREOF

(71) Applicants: Hyundai Motor Company, Seoul (KR); Kia Motors Corporation, Seoul (KR)

(72) Inventors: Eun Yeong Lee, Seoul (KR); In Woo Song, Yongin-si (KR); Sang Hak Kim, Seoul (KR); Mi Yeon Song, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 27 days.

(21) Appl. No.: 15/802,786

(22) Filed: Nov. 3, 2017

(65) Prior Publication Data

US 2018/0251034 A1   Sep. 6, 2018

(30) Foreign Application Priority Data

Mar. 2, 2017   (KR) .................. 10-2017-0026962

(51) Int. Cl.
*H01M 10/44* (2006.01)
*B60L 8/00* (2006.01)
(Continued)

(52) U.S. Cl.
CPC .......... *B60L 8/003* (2013.01); *B60L 11/1809* (2013.01); *H01L 31/0504* (2013.01);
(Continued)

(58) Field of Classification Search
CPC . H02J 7/35; H02J 7/355; Y02E 60/12; H01M 10/465; H01M 16/006

USPC ......................................................... 320/101
See application file for complete search history.

(56) References Cited

U.S. PATENT DOCUMENTS 6,476,315 B2   11/2002  Ganz
2006/0225781 A1*  10/2006  Locher .................. H01L 31/02
                                                                      136/245
(Continued)

FOREIGN PATENT DOCUMENTS

| JP | 9-294320 A | 11/1997 |
| JP | 2000-180253 A | 6/2000 |
| JP | 2013-107554 A | 6/2013 |

*Primary Examiner* — Arun C Williams
(74) *Attorney, Agent, or Firm* — Morgan, Lewis & Bockius LLP (57) ABSTRACT

A solar cell system may include a first power converting device connected to an output of a first solar cell; a second power converting device which an input connected to an output of a second solar cell connected to the first solar cell in parallel and an output connected to a circuit between the output of the first solar cell and the input of the first power converting device; a bypass circuit at the output of the second solar cell and connected to the circuit between the output of the first solar cell and the input of the first power converting device; a first circuit opening/closing device disposed in a circuit between the second solar cell and the first power converting device; a second circuit opening/closing device in the bypass circuit; and a path control device controlling opening or closing of the first and second circuit opening/closing devices, and a control method thereof.

20 Claims, 4 Drawing Sheets

(51) Int. Cl.
  *H01L 31/05*   (2014.01)
  *H01M 10/46*   (2006.01)
  *B60L 11/18*   (2006.01)
  *H02J 7/35*    (2006.01)
  *H02J 3/38*    (2006.01)
  *H02S 40/30*   (2014.01)

(52) U.S. Cl.
  CPC ........... *H01M 10/465* (2013.01); *H02J 3/385* (2013.01); *H02J 7/35* (2013.01); *H02S 40/30* (2014.12); *Y02E 10/50* (2013.01); *Y02T 10/7005* (2013.01); *Y02T 10/7083* (2013.01)

(56)       References Cited

U.S. PATENT DOCUMENTS

| | | |
|---|---|---|
| 2009/0314556 A1 | 12/2009 | Harris |
| 2010/0085670 A1* | 4/2010 | Palaniswami ............ H02H 7/20 361/42 |
| 2010/0206366 A1* | 8/2010 | English ............. H01L 31/02021 136/255 |
| 2010/0207455 A1* | 8/2010 | Erickson, Jr. ............. G05F 1/67 307/82 |
| 2010/0287388 A1* | 11/2010 | Suzuki ...................... G06F 1/28 713/300 |
| 2012/0096885 A1 | 4/2012 | Mak et al. |
| 2012/0126624 A1* | 5/2012 | Hester ...................... G05F 1/67 307/77 |
| 2012/0242303 A1* | 9/2012 | Ishii .......................... G05F 1/67 323/234 |
| 2013/0307342 A1* | 11/2013 | Niemela .................. H02J 1/00 307/82 |
| 2016/0233717 A1* | 8/2016 | Avrutsky .......... H01L 31/02021 |
| 2016/0297544 A1* | 10/2016 | Kim .......................... H02J 7/34 |

\* cited by examiner

SOLAR CELL SYSTEM AND CONTROL METHOD THEREOF

CROSS-REFERENCE(S) TO RELATED APPLICATION

The present application claims priority to Korean Patent Application No. 10-2017-0026962, filed on Mar. 2, 2017, the entire contents of which are incorporated herein for all purposes by this reference.

BACKGROUND OF THE INVENTION

Field of the Invention

The present invention relates to a solar cell system, and a control method thereof. More particularly, the present invention relates to a solar cell system configured for minimizing a loss of power generation and outputs of solar cells in a configuration where a plurality of solar cells is connected in parallel, and a control method thereof.

Description of Related Art

A solar cell is a photo-electric conversion device, which converts solar energy into electrical energy.

Traditionally, a monocrystalline or polycrystalline silicon solar cell is widely used as the solar cell, but the silicon solar cell requires large and expensive equipment during manufacturing and a raw material of the silicon solar cell is also expensive, thus manufacturing cost and production cost are high and there is a limit in improving efficiency of the conversion of solar energy into electrical energy, wherein a new alternative has been founded.

In the present respect, as an alternative of the silicon solar cell, an interest in a solar cell, which may be manufactured with low cost using an organic material, is increased, and a perovskite solar cell of which manufacturing cost is very low attracts large attention.

The perovskite solar cell may be manufactured of a transparent electrode, adopts various colors and designs, and has a visual advantage, that is a semitransparency characteristic, in which an external portion and an internal portion of the solar cell may be semi-transparently viewed, wherein the perovskite solar cell is advantageous in a field demanding transparency when compared to a conventional silicon solar cells or other solar cells.

The solar cell has a near infinite energy source and is environmentally friendly, unlike other energy sources, so that an importance thereof is increased as time goes by, and a utilization field thereof is broadened. Accordingly, in a vehicle business field, to meet the trend, a vehicle mounted with a system utilizing a solar cell and electrical energy output from the solar cell has been developed and released.

For example, a technology in which a solar cell module is mounted in a vehicle body (a roof panel or a sunroof/panorama roof) and a vehicle uses power generated with the solar cell has been developed.

When the solar cell is applied to the sun roof or the panorama roof, there is an advantage in that the solar cell may be utilized in various application and fields while maintaining a feeling of openness provided by the sunroof or the panorama roof.

The solar cell applied to the vehicle body may also be utilized as a power supply source of a parked vehicle, and for example, it is possible to operate a heating, ventilation, and air conditioning (HVAC) system with power generated by the solar cell while parked to decrease an internal temperature of the vehicle or perform heating, internal ventilation (parking ventilation), and the like.

The related art document about the technology, in which a solar cell is mounted in a vehicle to be used as a power supply source, includes US Patent Application Publication No. 2009-0314556, U.S. Pat. No. 6,476,315, Japanese Patent Application Laid-Open No. 2013-107554, and Japanese Patent Application Laid-Open No. 2000-180253.

US Patent Application Publication No. 2012-0096885 presents an air conditioning system using generated power of a solar cell, and an operating method thereof.

In the meantime, an operational state and an output of a solar cell may be varied according to an environmental factor, including an amount of incident light, an incident angle of light, and a component temperature in a vehicle mounted with a solar cell system, and thus there is a problem in an aspect of utilization of power output from the solar cell.

Figure 1:
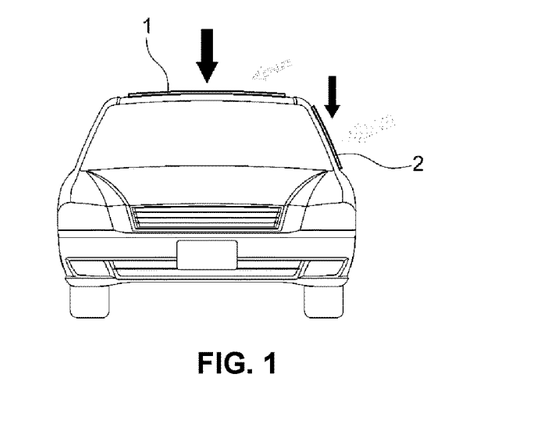
FIG. 1 is a diagram illustrating an example in which a plurality of solar cells is disposed in a vehicle.

As exemplified in FIG. 1, when two or more solar cells are disposed in a vehicle, a cell characteristic of each solar cell may be different, and there is a difference in an environmental condition due to a disposition location of the solar cell in the vehicle, wherein operation voltages of the solar cells may be different from each other.

As a result, when the solar cells are connected in parallel the amount of generated power is lost.

That is, when the solar cells having different operational voltages are connected in parallel, a total voltage generated from the solar cells may converge to a voltage of the solar cell having a small voltage.

Accordingly, when the solar cells are connected in parallel and are used there may be a problem in view of energy efficiency.

Referring to the example of FIG. 1, a solar cell 1 is disposed on a roof of a vehicle and a solar cell 2 is disposed on a side surface of the vehicle, and in the present case, a difference in the amount of incident light and a voltage between the two solar cells exhibited by the disposition locations is represented in Table 1 below. As shown in FIG. 1, the bold arrows show amount of the vertical incident light which is provided in a vertical direction of the vehicle in the noon. As the solar cell 1 is disposed on a roof of a vehicle and the solar cell 2 is disposed on a side surface of the vehicle, the solar cell 1 generates larger voltages than the solar cell 2. Furthermore, the gray arrows in FIG. 1 show the amount of the inclined light which is provided in an inclined direction with respect to the vehicle in the morning/afternoon. As the solar cell 1 is disposed on a roof of a vehicle and the solar cell 2 is disposed on a side surface of the vehicle, the solar cell 2 generates larger voltages than the solar cell 1.

TABLE 1

|  | Noon | | Morning/Afternoon | |
| --- | --- | --- | --- | --- |
|  | Amount of vertical incident light | Voltage | Amount of inclined incident light | Voltage |
| Solar cell 1 | Large | Large | Small | Small |
| Solar cell 2 | Small | Small | Large | Large |

Referring to Table 1, it can be seen that the voltages of the two solar cells are different due to a difference in environmental conditions, that is, a difference in the amount of incident light according to a disposition location and time.

As a result, to solve the aforementioned problem of the loss, it is normal to configure a system which adjusts the voltages of the solar cells to be equal using a separate power converting means, and the conventional art document thereof includes Japanese Patent Application Laid-Open No. 1997-294320.

According to the conventional art, in a system in which a plurality of solar cells is connected in parallel, a system in which solar cells including different numbers of serially connected cells are connected in parallel, a system in which solar cells using the different types of solar cell are connected in parallel, or a system in which solar cells, of which disposition locations in a vehicle are different, are connected in parallel, a separate power converting device including a maximum power point tracking control (MPPT) device and a DC-DC converter is disposed at an output side of the solar cell.

In the present case, the separate power converting device are disposed at the output side of at least one of solar cell modules, and an output side of the power converting device is connected to an output side of another solar cell module to match the outputs of the solar cell modules, which are connected in parallel, using the power converting means.

Another power converting device is disposed between a connection point, at which the solar cells are connected, and a load side. Power of the solar cell is converted into power which may be supplied to the load side using the power converting means.

However, in the above solar cell system, the separate power converting device is additionally disposed at the output side of the solar cell, wherein multiple losses are generated by the power conversion, increasing a loss of the entire system.

The information disclosed in this Background of the Invention portion is only for enhancement of understanding of the general background of the invention and should not be taken as an acknowledgement or any form of suggestion that this information forms the prior art already known to a person of skilled in the art.

BRIEF SUMMARY

Various aspects of the present invention are directed to providing a solar cell system, which is configured for minimizing a loss of generated power and outputs of solar cells in a configuration in which a plurality of solar cells is connected in parallel, and a control method thereof.

Various aspects of the present invention are directed to providing a solar cell system, which is configured for solving a problem of a power loss by a power converting device in a configuration in which solar cells exhibiting different outputs are connected in parallel, and a control method thereof.

Various aspects of the present invention are directed to providing a solar cell system including: a first power converting device, of which an input side is connected to an output side of a first solar cell and which converts input power and outputs the converted power; a second power converting device, of which an input side is connected to an output side of a second solar cell connected to the first solar cell in parallel, and an output side is connected to a circuit between the output side of the first solar cell and the input side of the first power converting device, and which converts power input from the second solar cell and outputs the converted power; a bypass circuit, which is branched from a circuit between the second solar cell and the second power converting device and is connected to the circuit between the output side of the first solar cell and the input side of the first power converting device; a first circuit opening/closing device, which is disposed in a circuit between a point at which the bypass circuit is branched, and the input side of the first power converting device, among the circuits at the output side of the second solar cell; a second circuit opening/closing device, which is disposed in the bypass circuit; and a path control device, which is configured to control an opening/closing operation of the first and second circuit opening/closing devices based on operation information related to the first and second solar cells wherein power of the second solar cell is supplied to the first power converting device through a path selected from a first path passing through the second power converting device and a second path passing through the bypass circuit.

Various aspects of the present invention are directed to providing a method of controlling a solar cell system including: a first power converting device, of which an input side is connected to an output side of a first solar cell and which converts input power and outputs the converted power; a second power converting device, of which an input side is connected to an output side of a second solar cell connected to the first solar cell in parallel, and an output side is connected to a circuit between the output side of the first solar cell and the input side of the first power converting device, and which converts power input from the second solar cell and outputs the converted power; a bypass circuit, which is branched from a circuit between the second solar cell and the second power converting device and is connected to the circuit between the output side of the first solar cell and the input side of the first power converting device; a first circuit opening/closing device, which is disposed in the circuit between a point at which the bypass circuit is branched, and the input side of the first power converting device, among the circuits at the output side of the second solar cell; and a second circuit opening/closing device, which is disposed in the bypass circuit, the method including: receiving, by a path control device, operation information related to the first and second solar cells; selecting and determining, by the path control device, a path, through which power of the second solar cell is configured to be supplied, between a first path passing through the second power converting device and a second path passing through a bypass circuit based on the received operation information related to the first and second solar cells; and controlling, by the path control device, opening/closing operations of the first and second circuit opening/closing device wherein the power of the second solar cell is supplied through the selected path.

According to the solar cell system and the control method of the present invention, a power supply path representing a minimum loss is determined and selected according to operational states of the solar cells which are connected in parallel, minimizing a loss of generated power and an output of the solar cell.

When a condition under which a large power loss is generated by a separate power converting device which matches the outputs of the solar cells is determined, a power supply path which bypasses the power converting device is selected, improving a problem of a power loss by the power converting means.

The methods and apparatuses of the present invention have other features and advantages which will be apparent from or are set forth in more detail in the accompanying drawings, which are incorporated herein, and the following Detailed Description, which together serve to explain certain principles of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention(s), examples of which are illustrated in the accompanying drawings and described below. While the invention(s) will be described in conjunction with exemplary embodiments, it will be understood that present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Throughout the specification and the claims, unless explicitly described to the contrary, the word "comprise" and variations including "comprises" or "comprising" will be understood to imply the inclusion of stated elements but not the exclusion of any other elements.

It is understood that the term "vehicle" or "vehicular" or other similar term as used herein is inclusive of motor vehicles in general including passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Various aspects of the present invention are directed to providing a solar cell system including heterogeneous solar cells which are connected in parallel and are configured for exhibiting different outputs, and a control method thereof.

Herein, the solar cell may mean a solar cell module formed by connecting a plurality of cells in series, or a solar cell array formed by connecting a plurality of solar cell modules in series.

The solar cell system according to an exemplary embodiment of the present invention may be a solar cell system for a vehicle formed by disposing a plurality of solar cells in a vehicle, and herein, the plurality of solar cells may be solar cells of which disposition locations in the vehicle are different, may be solar cell modules of which the numbers of serially connected cells are different, or a solar cell array of which the numbers of serially connected solar cell modules are different.

The solar cell system according to an exemplary embodiment of the present invention may be a hybrid solar cell system formed by connecting heterogeneous solar cells, which have different types, in parallel.

Here, the heterogeneous solar cells may be defined as different types of solar cells, that is, one or more solar cells among the total solar cells used in the solar cell system have a different output characteristic from those of the remaining solar cells.

For example, the heterogeneous solar cells may be solar cells of which fill factors (FF) and power-voltage (P-V) curves are different.

As an example, the heterogeneous solar cells may be a combination of an amorphous silicon solar cell and a crystalline silicon solar cell.

The amorphous silicon solar cell relatively has a small FF value and a small inclination of a P-V curve, but the crystalline silicon solar cell has a larger FF value and a larger inclination of a P-V curve than those of the amorphous silicon solar cell.

However, the present invention is not limited to a case where the solar cell system includes the amorphous silicon solar cell and the crystalline silicon solar cell, and the heterogeneous solar cells may be a combination of two or more kinds selected from the group including a semi-transparent solar cell (mainly, a solar cell of which transmittance of visual rays is 5% or more), including a dye sensitized solar cell, an organic solar cell, an amorphous silicon solar cell, a perovskite solar cell, a quantum dot solar cell, a crystalline silicon solar cell, and other publicly-known solar cells.

The solar cell system of the present invention may include solar cells which have an insulating layer inserted therebetween, are insulated by the insulating layer, and are connected in parallel (see FIG. 6), and, for example, the solar cell system may include a tandem solar cell.

Figure 2:
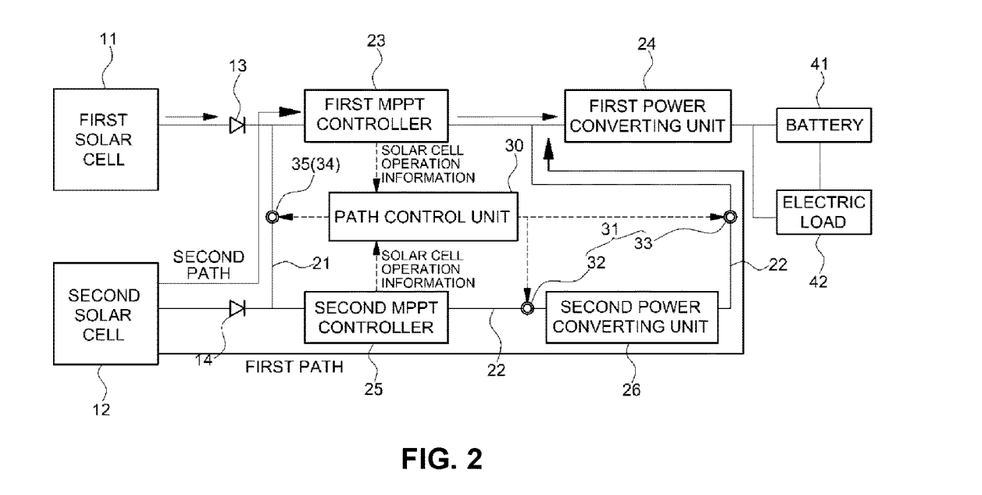
FIG. 2 is a block diagram illustrating an example of a configuration of a hybrid solar cell system according to an exemplary embodiment of the present invention.

FIG. 2 is a block diagram illustrating an example of a configuration of a hybrid solar cell system according to an exemplary embodiment of the present invention, and represents a configuration using two heterogeneous solar cells 11 and 12 which are connected in parallel.

In the description below, the two solar cells 11 and 12 will be divided into and referred to as a first solar cell 11 and a second solar cell 12.

As illustrated in FIG. 2, the solar cell system according to the exemplary embodiment of the present invention may include a first power converting device 24 of which an input side is connected to an output side of the first solar cell 11 and which converts input power and outputs the converted power; a second power converting device, of which an input side is connected to an output side of the second solar cell 12 connected to the first solar cell 11 in parallel, and an output side is connected to a circuit between the output side of the first solar cell 11 and the input side of the first power converting device 24, and which converts power input from the second solar cell 12 and outputs the converted power; a bypass circuit 21, which is branched from a circuit between the second solar cell 12 and the second power converting device 26 and is connected to the circuit between the output side of the first solar cell 11 and the input side of the first power converting device 24; a first circuit opening/closing device 31 which is disposed in the circuit between a point at which the bypass circuit 21 is branched at the output side of the second solar cell 12 and the input side of the first power converting device 24; a second circuit opening/closing device 34 which is disposed in the bypass circuit 21; and a path control device 30, which controls an opening/closing operation of the first and second circuit opening/closing devices 31 and 34 based on operation information related to the first and second solar cells 11 and 12 wherein power of the second solar cell 12 is supplied to the first power converting device 24 through a path selected from a first path passing through the second power converting device 26 and a second path passing through the bypass circuit 21.

Each configuration of the exemplary embodiment will be described in more detail. First, maximum power point tracking (MPPT) controllers 23 and 25 and the power converting devices 24 and 26, which control the outputs of the solar cells and adjusts power generated by the solar cells to supply the power to a vehicle, are disposed at the output sides of the solar cells 11 and 12.

The power converting devices 24 and 26 may be disposed between the solar cell and a load within the vehicle to convert power of the solar cells 11 and 12 and supply the converted power to the vehicle, and may be DC-DC converters.

Herein, the load within the vehicle may include a battery 41 and various electrical loads 42 consuming power in the vehicle.

Although not illustrated in the drawing, the solar cell system of the exemplary embodiment includes a solar cell detecting device, which detects power generation states and operational states of the solar cells 11 and 12 as a publicly known constituent element, and the solar cell detecting device may be a typical solar cell detector configured for detecting a voltage and a current of the solar cell.

Solar cell voltage and current values, which are real-time detection values of the solar cell detecting device, are input into the MPPT controllers 23 and 25.

The solar cell voltage means an operation voltage of the solar cell, that is, an output voltage of the solar cell, and the voltage of the solar cell may also be controlled by controlling, utilizing the MPPT controllers 23 and 25, the outputs of the DC-DC converters that are the power converting devices 24 and 26.

In the exemplary embodiment of FIG. 2, the first MPPT controller 23 and the first power converting device 24 are connected to the output side of the first solar cell 11 through the circuit, and the second MPPT controller 25 and the second power converting device 26 are connected to the output side of the second solar cell 12 through the circuit.

The output side of the second power converting device 26 is connected to the input side of the first power converting device 24 through the circuit.

Accordingly, both the circuit at the output side of the first solar cell 11 and the circuit at the output side of the second power converting device 26, which is configured to convert power output from the second solar cell 12, are connected to the circuit at the input side of the first power converting device 24.

Finally, the output side of the second solar cell 12 is also connected to the input side of the first power converting device 24 through the circuit to supply power to the input side of the first power converting device 24.

Reverse current preventing diodes 13 and 14 are disposed in the circuit at the output side of the first solar cell 11 and the circuit at the output side of the second solar cell 12, respectively, and the circuit at the output side of the first solar cell 11 and the circuit at the output side of the second solar cell 12 are connected through the bypass circuit 21 at rear end portions of the diodes 13 and 14.

The bypass circuit 21 is branched from a position of the rear end portion of the reverse current preventing diode 14 of the circuit at the output side of the second solar cell 12 and is connected to a position of the rear end portion of the reverse current preventing diode 13 of the circuit at the output side of the first solar cell 11.

The bypass circuit 21 forms a power supply path which bypasses the power generated and output by the second solar cell 12 wherein the power is supplied to the first power converting device 24 without passing through the second power converting device 26.

In the description below, a circuit, which is a circuit connected from the point at which the bypass circuit 21 is branched in the circuit at the output side of the second solar cell 12 to the input side of the first power converting device 24 via the second power converting device 26, and is a circuit which provides a power supply path for supplying the power generated and output by the second solar cell 12 to the first power converting device 24 via the second power converting device 26, will be referred to as a main circuit 22.

Finally, the power generated and output by the second solar cell 12 is supplied to the first power converting device 24 through the bypass circuit 21 or is supplied to the first power converting device 24 via the second power converting device 26 through the main circuit 22, and when the power passes through the second power converting device 26, the power is converted in the second power converting device 26 and then is supplied to the first power converting device 24.

The first circuit opening/closing device 31, which opens or closes a circuit according to a control signal of the path control device 30, is disposed in the main circuit 22 between the point at which the bypass circuit 21 is branched in the circuit at the output side of the second solar cell 12 and the first power converting device 24.

The second circuit opening/closing device 34, which opens or closes a circuit according to a control signal of the path control device 30, is disposed in the bypass circuit 21.

The first circuit opening/closing device 31 may be formed by disposing switches 32 and 33 in the main circuit 22 at the output side of the second solar cell 12, and the second circuit opening and closing device 34 may be formed by disposing a switch 35 in the bypass circuit 21.

The first circuit opening/closing device 31 may include the first switch 32, which is disposed in a circuit between the second MPPT controller 25 and the second power converting device 26, and the second switch 33 disposed in a circuit between the second power converting device 26 and the first power converting device 24.

Finally, in the solar cell system of the present invention, the opening or closing of the first circuit opening/closing device 31 and the second circuit opening/closing device 34 is controlled, wherein the power generated and output from the second solar cell 12 is supplied to the first power converting device 24 through the first path, which passes through the second power converting device 26 along the main circuit 22, in the state where the first circuit opening/closing device 31 is closed and the second circuit opening/closing device 34 is opened, or is directly supplied to the first power converting device 24 through the second path including the bypass circuit 21 without passing through the second power converting device 26 in the state where the first circuit opening/closing device 31 is opened and the second circuit opening/closing device 34 is closed.

In the meantime, the MPPT controllers 23 and 25 are configured to perform the MPPT control for controlling the outputs of the corresponding solar cells 11 and 12.

In the present case, each of the MPPT controllers 23 and 25 performs a MPPT tracking control which enables the solar cells 11 and 12 to output maximum power according to a predetermined MPPT algorithm using the voltage and the current of the solar cell detected by the solar cell detecting device, and to the present end, the MPPT controllers 23 and 25 are configured to control the operations of the power converting devices (that is, the DC-DC converters) 24 and 26.

That is, the first MPPT controller 23 is configured to control the output and the operation of the first power converting device 24, and the second MPPT controller 25 is configured to control the output and the operation of the second power converting device 26.

As it is known, solar energy generation has low power generation efficiency, wherein it is required to perform MPPT control, which enables the power converting device to extract maximum power in the solar cell.

The maximum power point, at which maximum power is extractable in the solar cell, is changed according to an environmental conditions, including the amount of solar radiation and a surface temperature, and an operational point of the solar cell is determined by a load condition.

Accordingly, it is necessary to instantaneously control the power converting device (that is, the DC-DC converter) configured as the load side wherein the operation point of the solar cell tracks the maximum power point.

The MPPT control, which instantaneously controls the power converting device, wherein the operation point of the solar cell tracks the maximum power point according to an output characteristic of the solar cell, is one of the most important factors directly influencing the amount of generated power of the solar cell system.

Regarding the MPPT control, various MPPT algorithms are known, the solar cell system of the present invention may adopt one of the publicly known MPPT algorithms, and the MPPT control and the algorithm thereof applied to the solar cell system of the present invention are not particularly limited, wherein a detailed description of the MPPT control will be omitted.

In the meantime, the path control device 30 receives operational information related to the solar cells 11 and 12 from the MPPT controllers 23 and 25, and determines a path, through which power of the second solar cell 12 is configured to be supplied, between the first path and the second path based on the operational information related to each solar cell.

Herein, the operational information related to the solar cells 11 and 12 may be a maximum power $P_{m,1}$ and $P_{m,2}$ which are output values of the solar cells at the maximum power point as well as maximum power voltages $V_{pm,1}$ and $V_{pm,2}$ which are voltage values at the maximum power point (the operation voltage at the maximum output).

The maximum power $P_{m,1}$ and $P_{m,2}$ and the maximum power voltages $V_{pm,1}$ and $V_{pm,2}$ are information which the MPPT controllers 23 and 25 determine and transmit to the path control device 30 when performing the MPPT control for the corresponding solar cells 11 and 12.

The path control device 30 outputs control signals for controlling opening or closing operations of the first circuit opening/closing device 31 and the second circuit opening/closing device 34 wherein the power of the second solar cell 12 may be supplied along the determined power supply path.

Accordingly, the opening or closing of the first circuit opening/closing device 31 and the second circuit opening/closing device 34 is controlled by the control signal output by the path control device 30, and finally, the power of the second solar cell 12 may be supplied along the power supply path selected between the first path and the second path.

That is, the power of the second solar cell 12 may be supplied to the first power converting device 24 along the first path, which passes through the second power converting device 26, through the main circuit 22, or may be supplied to the first power converting device 24 along the second path including the bypass circuit 21.

Hereinafter, a control method of the solar cell system according to an exemplary embodiment of the present invention will be described in detail.

Figure 3:
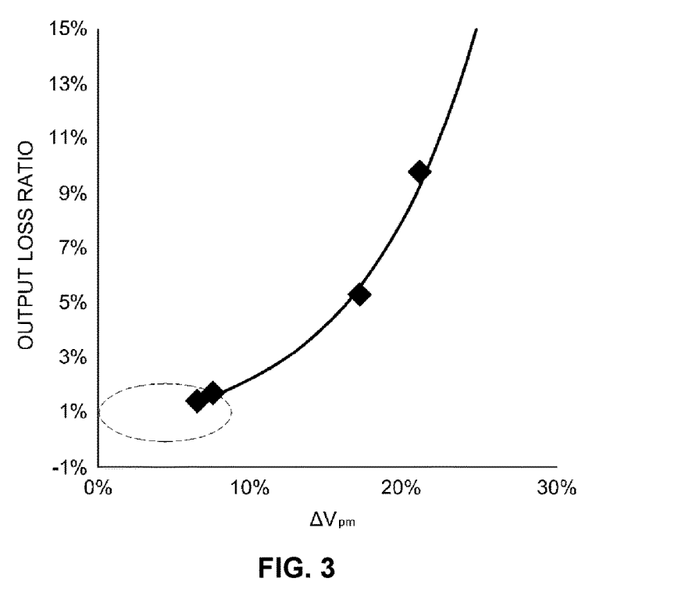
FIG. 3 is a graph illustrating an output loss ratio according to a voltage difference when an amorphous silicon solar cell and a crystalline silicon solar cell are connected in parallel.

First, in the hybrid solar cell system formed of the heterogeneous solar cells, in the case where one or more solar cells are the solar cells having a small FF value, as illustrated in FIG. 3, when a separate power converting device (the second power converting device 26 in the exemplary embodiment of FIG. 2) is not used, an output loss is less within a specific voltage difference range.

Herein, an example of the solar cell having the small FF value may include a solar cell in which FF<0.7, and may mainly be a solar cell (for example, an amorphous silicon solar cell) in which transmittance of visual rays is 5% or more.

FIG. 3 is a diagram illustrating an output loss ratio according to a voltage difference when an amorphous silicon solar cell and a crystalline silicon solar cell are connected in parallel, and represents an output loss ratio (%) when two kinds of solar cells are connected in parallel without using the separate power converting means.

Herein, the output loss ratio means a ratio of power loss by the power converting means (DC-DC converter) to an output of the amorphous silicon solar cell, and a voltage difference ($\Delta V_{pm}$) means a difference in a maximum power voltage (a voltage at the maximum power point) between the heterogeneous solar cells under the same environmental conditions, and in FIG. 3, the voltage difference $\Delta V_{pm}$ is represented with a ratio (%) of a voltage difference to a maximum power voltage of the amorphous silicon solar cell.

Referring to FIG. 3, when an output loss ratio by the separate power converting device is 5%, there exists a voltage difference portion in which an output loss ratio shown when two kinds of solar cells are connected in parallel without using a separate power converting device is less than 5%.

For example, when the voltage difference $\Delta V_{pm}$ is within 10%, the output loss ratio has a value smaller than 2%.

Finally, under a condition in which an output loss is smaller when the power converting device is not used compared to the case where the power converting device is used, it is advantageous that the power of the solar cell does not pass through the power converting means, and based on the matter the present invention controls wherein the power supply path, in which an output loss is small, is selected based on the operation information related to the solar cell.

That is, in the exemplary embodiment of FIG. 2, the path control device 30 determines a path in which an output loss is small between the first path, which passes through the second power converting device 26 that is the separate power converting means, and the second path, which bypasses the second power converting device 26, based on the operational information related to the solar cells 11 and 12 received from the first MPPT controller 23 and the second MPPT controller 25, and subsequently, selects the power supply path wherein power of the second solar cell 12 is supplied through the determined path and performs the control.

Herein, the operational information related to the solar cells may be maximum power $P_{m,1}$ and $P_{m,2}$ which are output values of the solar cells at the maximum power point and maximum power voltages $V_{pm,1}$ and $V_{pm,2}$ which are voltage values at the maximum power point (the operation voltage at the maximum output).

When the first path is selected, the path control device 30 closes the first circuit opening/closing device 31 (the first switch 32 and the second switch 33) and opens the second circuit opening/closing device 34, as described above, to allow the power of the second solar cell 12 to be supplied through the main circuit 22, and in the present case, the power of the second solar cell 12 passes through the second power converting device 26 and then is supplied to the first power converting device 24 together with the power of the first solar cell 11.

The second power converting device 26 converts the voltage of the second solar cell 12 into the same voltage as the voltage of the first solar cell 11, and the first power converting device 24 converts the input voltage into a voltage which may be supplied to the load within the vehicle and outputs the converted voltage.

On the other hand, when the second path is selected, the path control device 30 opens the first circuit opening/closing device 31 and closes the second circuit opening/closing device 34 to allow the power of the second solar cell 12 to be supplied through the bypass circuit 21, and in the present case, the power of the second solar cell 12 is directly supplied to the first power converting device 24 together with the power of the first solar cell 11 without passing through the second power converting device 26.

Figure 4:
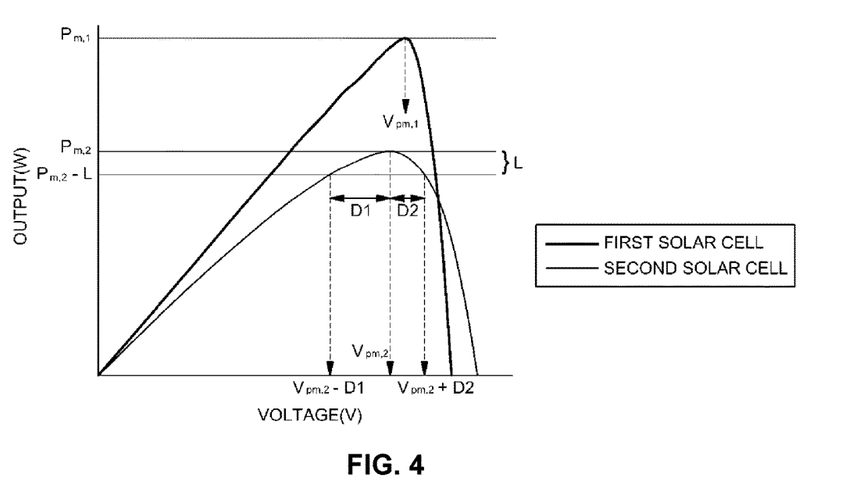
FIG. 4 is a graph illustrating a P-V curve for each solar cell.

In the meantime, FIG. 4 is a diagram illustrating an example of a power-voltage curve (hereinafter, referred to as a "P-V curve") for each solar cell in the solar cell system including the heterogeneous solar cells.

In the example of FIG. 4, the first solar cell 11 may be the solar cell, of which an FF value is larger and an inclination of a P-V curve is larger than those of the second solar cell 12, and the second solar cell 12 may be a solar cell, of which an FF value is relatively small (for example, FF<0.7) and an inclination of a P-V curve is relatively small.

The first solar cell 11 may be a crystalline silicon solar cell, and the second solar cell 12 may be an amorphous silicon solar cell.

In FIG. 4, L represents a power loss in the second power converting device 26 disposed at an output side of the second solar cell 12, and $P_{m,1}$ represents maximum power W (an output value at the maximum power point) of the first solar cell 11, and $P_{m,2}$ represents maximum power W of the second solar cell 12.

$V_{pm,1}$ represents a voltage value at the maximum power point of the first solar cell 11, that is, a maximum power voltage V of the first solar cell 11, and $V_{pm,2}$ represents a voltage value at the maximum power point of the second solar cell 12, that is, a maximum power voltage V of the second solar cell 12.

In the case where the maximum power voltage $V_{pm,1}$ of the first solar cell 11 is within voltage values at two points at which the output W of the second solar cell 12 has a value of $P_{m,2}$–L, that is, a voltage range between '$V_{pm,2}$–D1' and '$V_{pm,2}$+D2' (hereinafter, D1 and D2 may have the same value or different values, and has positive values), in the P-V curve of the second solar cell 12, when the power of the second solar cell 12 is supplied through the second path, a power loss is small compared to a power loss when the second solar cell 12 is supplied through the first path.

Accordingly, in an exemplary embodiment of the present invention, the path control device 30 compares the maximum power voltage $V_{pm,1}$ that is one of the operation information related to the first solar cell 11 with the voltage range, that is, a bypass allowable voltage range, and when the maximum power voltage of the first solar cell 11 is within the bypass allowable voltage range the path control device 30 selects the second path which bypasses the power of the second solar cell 12 through the bypass circuit 21 without passing through the second power converting device 26 to be supplied to the first power converting device 24.

The bypass allowable voltage range is increased (a value of "D1+D2" is increased) in a solar cell of which the FF value is small and an inclination of the P-V curve is small.

Figure 5:
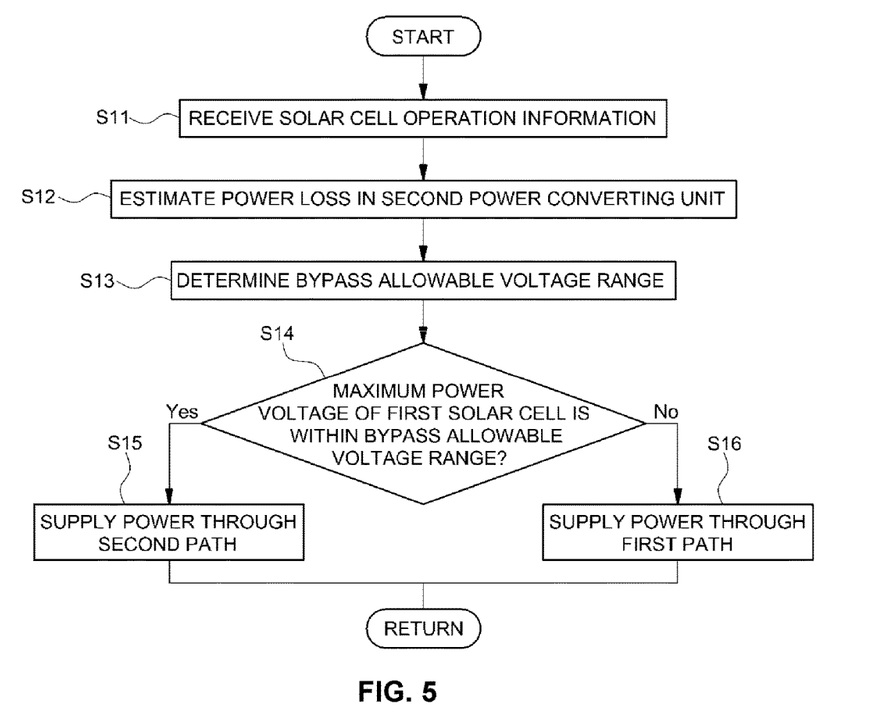
FIG. 5 is a flowchart illustrating a control method of a solar cell system according to an exemplary embodiment of the present invention.

The control process of the present invention will now be described in more detail. FIG. 5 is a flowchart illustrating a control method of the solar cell system according to an exemplary embodiment of the present invention.

First, the path control device 30 receives operational information related to the solar cells 11 and 12 from the first MPPT controller 23 and the second MPPT controller 25 (S11).

The path control device 30 determines a power loss L in the second power converting device 26 based on the received operation information related to the second solar cell 12 (S12), and in the present case, the power loss L of the second power converting device 26 device the amount of power loss represented when power of the second solar cell 12 passes through the second power converting device 26, and is changed according to a maximum power voltage $V_{pm,2}$ of the second solar cell 12 that is an input voltage of the second power converting device 26 or maximum power $P_{m,2}$ of the second solar cell 12 that is an input power voltage.

Accordingly, the path control device 30 determines the power loss L of the second power converting device 26 using setting data from the maximum power voltage $V_{pm,2}$ or the maximum power $P_{m,2}$ in the operation information related to the second solar cell 12.

In the present case, the setting data for determining the power loss L may be data which is input and stored in the path control device 30 in advance, and may be data which defines a correlation between the maximum power voltage $V_{pm,2}$ or the maximum power $P_{m,2}$ and the power loss L in advance, for example map data, in which the power loss L is set with a value according to the maximum power voltage $V_{pm,2}$ or the maximum power $P_{m,2}$.

The setting data may be determined using data obtained through an advanced test and an evaluation process performed in a development operation.

Otherwise, when a fixed loss ratio of the second power converting device 26 is determined in the development operation, the determined fixed loss ratio may be input and stored in the path control device in advance, and then the path control device 30 may determine the power loss L of the second power converting device 26 with a value obtained by multiplying the maximum power $P_{m,2}$ of the second solar cell 12, which is real-time information, and the fixed low ratio.

Subsequently, when the power loss L in the second power converting device 26 is determined and estimated as described above, the path control device 30 determines values of D1 and D2 that are range setting values using the estimated power loss L and the setting data from the maximum power $P_{m,2}$ and the maximum power voltage $V_{pm,2}$ which are the operational information related to the second solar cell 12.

In the present case, the setting data for determining the values of D1 and D2, which are the range setting values, is data input and stored in the path control device 30 in advance, and may be data which defines a correlation between the values of D1 and D2 and the power loss L, and the maximum power $P_{m,2}$ and the maximum power voltage $V_{pm,2}$ of the second solar cell 12 in advance, for example map data, in which the values of D1 and D2 is set according to the values of the power loss L, the maximum power $P_{m,2}$, and the maximum power voltage $V_{pm,2}$.

The setting data may be determined using data obtained through an advanced test and an evaluation process performed in a development operation.

The values of D1 and D2 in the setting data are difference values between the maximum power voltage $V_{pm,2}$ of the second solar cell 12 and a voltage corresponding to power (output) $P_{m,2}$–L of the second solar cell 12 in the P-V curve of the second solar cell 12 illustrated in FIG. 3.

Herein, $P_{m,2}$ is maximum power of the second solar cell 12 and L is a power loss of the second power converting device 26.

Referring to FIG. 4, there exists two points at which the P-V curve of the second solar cell 12 meets a horizontal line of $P=P_{m,2}$–L, and the two points exist at both left and right sides based on a peak point ($P=P_{m,2}$, $V=V_{pm,2}$) representing maximum power.

In the present case, a difference between the maximum power voltage (a voltage value at the peak point) and the voltage value at the left side point between the two points is D1, a difference between the voltage value at the right point and the maximum power voltage is D2, and the voltages (the voltage values of the two points) corresponding to the output $P_{m,2}$–L of the second solar cell 12 are $V_{pm,2}$–D1 and $V_{pm,2}$–D2.

As such, the path control device 30 determines a bypass allowable voltage range from the values of D1 and D2 and the maximum power voltage $V_{pm,2}$ of the second solar cell 12 (S13), and in the present case the bypass allowable voltage range is set with a voltage range between $V_{pm,2}$–D1 and $V_{pm,2}$+D2.

The path control device 30 compares the maximum power voltage $V_{pm,1}$ that is the operation information related to the first solar cell 11 with the determined bypass allowable voltage range (S14), and determines whether the maximum power voltage $V_{m,1}$ of the first solar cell 11 is within the bypass allowable voltage range ($V_{pm,2}$–D1 $\leq V_{pm,1} \leq V_{pm,2}$+D2).

Herein, when the maximum power voltage $V_{m,1}$ of the first solar cell 11 has a value ($V_{pm,2}$–D1$\leq V_{pm,1} \leq V_{pm,2}$+D2) within the bypass allowable voltage range, the path control device 30 selects the second path, and otherwise, the path control device 30 selects the first path (S15 and S16), and the path control device 30 generates a control signal for the first circuit opening/closing device 31 and the second circuit opening/closing device 34 wherein the power of the second solar cell 12 is supplied through the selected path and outputs the generated control signal.

Finally, under the condition in which the maximum power voltage $V_{m,1}$ of the first solar cell 11 has the value ($V_{pm,2}$–D1$\leq V_{pm,1} \leq V_{pm,2}$+D2) within the bypass allowable voltage range, a loss by the second power converting device 26 is larger than the case where the second power converting device 26 is not used (the power is bypassed), wherein the power of the second solar cell 12 is supplied through the second path including the bypass circuit 21.

In the meantime, under the condition in which the maximum power voltage $V_{pm,1}$ of the first solar cell 11 is not within the bypass allowable voltage range, the case where the second power converting device 26 is used is advantageous in an aspect of a loss ratio compared to the case where the second power converting device 26 is not used, wherein the power of the second solar cell 12 is supplied through the first path which passes through the second power converting device 26.

As described above, in an exemplary embodiment of the present invention, when the condition under which a large power loss is generated by the separate power converting device which matches the outputs of the solar cells, is determined, the power supply path, which bypasses the power converting means, is selected, improving a problem of a power loss by the power converting means.

Figure 6:
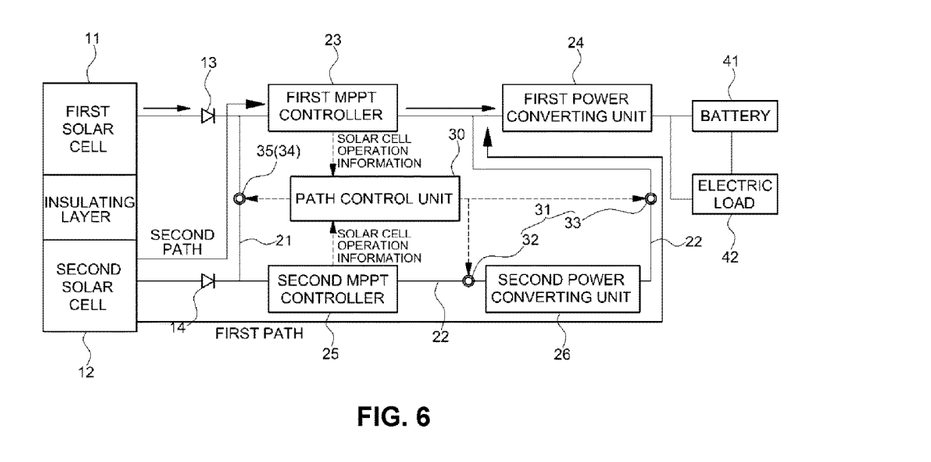
FIG. 6 is a diagram illustrating an example of a configuration in which an insulating layer is inserted between the solar cells in the exemplary embodiment of the present invention.

FIG. 6 is a diagram illustrating an example of a configuration in which an insulating layer is inserted between the solar cells, in the exemplary embodiment of the present invention, and as illustrated in FIG. 6, the present invention is also applicable to a solar cell system including solar cells which are insulated by an insulating layer and are connected in parallel.

For convenience in explanation and accurate definition in the appended claims, the terms "upper", "lower", "up", "down", "upwards", "downwards", "internal", "outer", "inside", "outside", "inwardly", "outwardly", "internal", "external", "front", "rear", "back", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A solar cell system, comprising:
   a first power converting device, of which an input side is connected to an output side of a first solar cell and which converts input power and outputs the converted power;
   a second power converting device, of which an input side is connected to an output side of a second solar cell connected to the first solar cell in parallel, and an output side is connected to a circuit between the output side of the first solar cell and the input side of the first power converting device, and which converts power input from the second solar cell and outputs the converted power;
   a bypass circuit, which is branched from a circuit between the second solar cell and the second power converting device and is connected to the circuit between the output side of the first solar cell and the input side of the first power converting device;

a first circuit opening/closing device, which is disposed in a circuit between a point at which the bypass circuit is branched and the input side of the first power converting device, among the circuits at the output side of the second solar cell;

a second circuit opening/closing device, which is disposed in the bypass circuit; and a path control device, which controls an opening or closing operation of the first and second circuit opening/closing devices based on operational information related to the first and second solar cells wherein power of the second solar cell is supplied to the first power converting device through a path selected from a first path passing through the second power converting device and a second path passing through the bypass circuit.

2. The solar cell system of claim 1, wherein the operational information related to the first and second solar cells are maximum power and maximum power voltages of the first and second solar cells determined for a maximum power point tracking (MPPT) control of the first solar cell and the second solar cell.

3. The solar cell system of claim 2, wherein the path control device is configured to determine a power loss of the second power converting device based on the maximum power or the maximum power voltage of the second solar cell, is configured to compare the maximum power voltage of the first solar cell with a bypass allowable voltage range determined based on the power loss, the maximum power, and the maximum power voltage of the second solar cell, and selects a path between the first path and the second path.

4. The solar cell system of claim 3, wherein the path control device is configured to determine the power loss using setting data, in which the power loss in the second power converting device is set with a value according to one of the maximum power and the maximum power voltage of the second solar cell.

5. The solar cell system of claim 3, wherein the path control device is configured to determine the power loss in the second power converting device based on a value obtained by multiplying the maximum power of the second solar cell with a predetermined fixed loss ratio of the second power converting device.

6. The solar cell system of claim 3, wherein the path control device is configured to determine values of a first value (D1) and a second value (D2) which are range setting values from the power loss, the maximum power, and the maximum power voltage of the second solar cell, and is configured to determine a voltage range between $V_{pm,2}-D1$ and $V_{pm,2}+D2$ (herein, $V_{pm,2}$ is the maximum power voltage of the second solar cell) as the bypass allowable voltage range.

7. The solar cell system of claim 6, wherein the path control device is configured to determine the values of D1 and D2 using setting data, in which the values of D1 and D2 are set with values according to the power loss, the maximum power, and the maximum power voltage of the second solar cell.

8. The solar cell system of claim 6, wherein the values of D1 and D2 are difference values between the maximum power voltage $P_{m,2}$ of the second solar cell and a voltage corresponding to the power $P_{m,2}-L$ (herein, L is the power loss) of the second solar cell in a P-V curve of the second solar cell.

9. The solar cell system of claim 3, wherein when the maximum power voltage of the first solar cell is within the bypass allowable voltage range the path control device selects the second path, and when the maximum power voltage of the first solar cell is not within the bypass allowable voltage range the path control device selects the first path.

10. The solar cell system of claim 1, wherein the first solar cell and the second solar cell are heterogeneous solar cells of which disposition locations in a vehicle are different, heterogeneous solar cells of which the numbers of serially connected cells are different, or heterogeneous solar cells of which the kinds of cells are different.

11. A method of controlling a solar cell system including: a first power converting device, of which an input side is connected to an output side of a first solar cell and which converts input power and outputs the converted power; a second power converting device, of which an input side is connected to an output side of a second solar cell connected to the first solar cell in parallel, and an output side is connected to a circuit between the output side of the first solar cell and the input side of the first power converting device, and which converts power input from the second solar cell and outputs the converted power; a bypass circuit, which is branched from a circuit between the second solar cell and the second power converting device and is connected to the circuit between the output side of the first solar cell and the input side of the first power converting device; a first circuit opening/closing device, which is disposed in a circuit between a point at which the bypass circuit is branched, and the input side of the first power converting device, among the circuits at the output side of the second solar cell; and a second circuit opening/closing device which is disposed in the bypass circuit, the method including:

receiving, by a path control device, operational information related to the first and second solar cells;

selecting and determining, by the path control device, a path, through which power of the second solar cell is configured to be supplied, between a first path passing through the second power converting device and a second path passing through a bypass circuit based on the received operational information related to the first and second solar cells; and controlling, by the path control device, opening or closing operations of the first and second circuit opening/closing device wherein the power of the second solar cell is supplied through the selected path.

12. The method of claim 11, wherein the operation information related to the first and second solar cells is maximum power and maximum power voltages of the solar cells determined for a maximum power point tracking (MPPT) control of the first solar cell and the second solar cell.

13. The method of claim 12, wherein in the selecting and determining of the path through the power of the second solar cell is configured to be supplied, the path control device is configured to determine a power loss of the second power converting device based on the maximum power or the maximum power voltage of the second solar cell, is configured to compare the maximum power voltage of the first solar cell with a bypass allowable voltage range determined based on the power loss and a maximum power and a maximum power voltage of the second solar cell, and selects a path between the first path and the second path.

14. The method of claim 13, wherein the path control device is configured to determine the power loss using setting data, in which the power loss in the second power converting device is set with a value according to one of the maximum power and the maximum power voltage of the second solar cell.

15. The method of claim 13, wherein the path control device is configured to determine the power loss in the second power converting device based on a value obtained by multiplying the maximum power of the second solar cell with a predetermined fixed loss ratio of the second power converting device.

16. The method of claim 13, wherein the path control device is configured to determine values of a first value (D1) and a second value (D2) that are range setting values from the power loss, the maximum power, and the maximum power voltage of the second solar cell, and is configured to determine a voltage range between $V_{pm,2}$−D1 and $V_{pm,2}$+D2 (herein, $Vp_{m,2}$ is the maximum power voltage of the second solar cell) as the bypass allowable voltage range.

17. The method of claim 16, wherein the path control device is configured to determine the values of D1 and D2 using setting data, in which the values of D1 and D2 are set with values according to the power loss, the maximum power, and the maximum power voltage of the second solar cell.

18. The method of claim 16, wherein the values of D1 and D2 are difference values between the maximum power voltage $P_{m,2}$ of the second solar cell and a voltage corresponding to the power $P_{m,2}$−L (herein, L is the power loss) of the second solar cell in a P-V curve of the second solar cell.

19. The method of claim 13, wherein when the maximum power voltage of the first solar cell is within the bypass allowable voltage range, the path control device selects the second path, and when the maximum power voltage of the first solar cell is not within the bypass allowable voltage range, the path control device selects the first path.

20. The method of claim 11, wherein the first solar cell and the second solar cell are heterogeneous solar cells of which disposition locations in a vehicle are different, heterogeneous solar cells of which the numbers of serially connected cells are different, or heterogeneous solar cells of which the kinds of cells are different.

\* \* \* \* \*